US006449871B1

United States Patent
Kholodenko et al.

(10) Patent No.: US 6,449,871 B1
(45) Date of Patent: Sep. 17, 2002

(54) SEMICONDUCTOR PROCESS CHAMBER HAVING IMPROVED GAS DISTRIBUTOR

(75) Inventors: Arnold Kholodenko, San Francisco; Dmitry Lubomirsky, Cupertino; Guang-Jye Shiau, San Jose; Peter K. Loewenhardt, San Jose; Shamouil Shamouilian, San Jose, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/657,997

(22) Filed: Sep. 8, 2000

Related U.S. Application Data

(62) Division of application No. 09/086,704, filed on May 28, 1998, now Pat. No. 6,185,839.

(51) Int. Cl.[7] .................................................. F26B 3/34
(52) U.S. Cl. ........................... 34/255; 34/258; 34/413; 34/418; 34/420; 34/526; 34/565
(58) Field of Search ..................... 34/255, 258, 413, 34/418, 420, 526, 562, 565, 60, 61, 90, 195, 210; 118/715, 723

(56) References Cited

U.S. PATENT DOCUMENTS

| | | | |
|---|---|---|---|
| 4,935,661 A | 6/1990 | Heinecke et al. | 313/231.31 |
| 5,269,847 A | 12/1993 | Anderson et al. | 118/715 |
| 5,324,411 A | 6/1994 | Ichishima et al. | 204/298.33 |
| 5,455,070 A | 10/1995 | Anderson et al. | 427/248.1 |
| 5,522,934 A | 6/1996 | Suzuki et al. | 118/723 AN |
| 5,556,521 A | 9/1996 | Ghanbari | 204/192.32 |
| 5,653,808 A | 8/1997 | MacLeish et al. | 118/715 |
| 5,683,517 A | 11/1997 | Shan | 118/723 E |
| 5,710,407 A | 1/1998 | Moore et al. | 219/405 |
| 5,767,628 A | 6/1998 | Keller et al. | 34/111.51 |
| 6,015,591 A | * 1/2000 | Li et al. | 427/255.23 |
| 6,090,210 A | * 7/2000 | Ballance et al. | 118/725 |
| 6,093,252 A | * 7/2000 | Wengert et al. | 118/719 |
| 6,113,984 A | * 9/2000 | MacLeish et al. | 427/255.32 |
| 6,153,012 A | * 11/2000 | Rupp et al. | 118/715 |

FOREIGN PATENT DOCUMENTS

| | | |
|---|---|---|
| EP | 0410442 | 1/1991 |
| EP | 0709875 | 5/1996 |
| EP | 0880164 | 11/1998 |
| WO | WO9800576 | 1/1998 |

OTHER PUBLICATIONS

PCT Search Report dated Oct. 20, 1999, European Patent Office, P.B. 5818 Patentlaan 2, NL–2280 HV Rijswijk.

* cited by examiner

*Primary Examiner*—William Doerrler
*Assistant Examiner*—Mark S. Shulman
(74) *Attorney, Agent, or Firm*—Ashok Janah; Joseph Bach

(57) ABSTRACT

A process chamber 25 for processing a semiconductor substrate, comprises a support for supporting a substrate 50. A gas distributor 90 provided for introducing process gas into the chamber 25, comprises a gas nozzle for injecting process gas at an inclined angle relative to a plane of the substrate 50, into the chamber 25. Optionally, a gas flow controller 100 controls and pulses the flow of process gas through one or more gas nozzles 140. An exhaust is used to exhaust the process gas from the chamber 25.

37 Claims, 7 Drawing Sheets ved gas distributor of the present invention.

SEMICONDUCTOR PROCESS CHAMBER HAVING IMPROVED GAS DISTRIBUTOR

CROSS-REFERENCE

This application is a divisional of U.S. patent application Ser. No. 09/086,704, filed on May 28, 1998, now U.S. Pat. No. 6,185,839, entitled "Semiconductor Process Chamber Having Improved Gas Distributor" which is incorporated herein by reference in its entirety.

BACKGROUND

This invention relates to a process chamber for processing semiconductor substrates, and in particular to a gas distributor for distributing process gas into the process chamber.

A process gas distributor that provides a non-uniform distribution of process gas in a process chamber can cause large variations in processing rates and uniformity across a surface of a substrate processed in the chamber. In semiconductor fabrication, process gas is introduced into the chamber and a plasma is formed from the process gas to etch or deposit material on the substrate. However, current semiconductor substrates have increased in diameter from 100 mm (4 inches) to 300 mm (12 inches). The proportionate increase in the volume of the chamber has made it more difficult to provide a uniform distribution of process gas or plasma species across the entire processing surface of the substrate. As a result, there is often considerable variation in processing rates and processing uniformity from the center to the periphery of the substrate.

Achieving a uniform process gas distribution is a particular problem in process chambers having ceramic walls or ceilings because it is difficult to fabricate the ceramic components with feed-throughs that allow gas nozzles to extend therethrough to uniformly distribute process gas into the process chamber. The ceramic walls are composed of polycrystalline ceramic material, such as aluminum oxide or silicon, which are brittle materials and difficult to machine holes for holding a gas feedthrough without breaking or otherwise damaging the ceramic component. Also, other components, such as RF induction coils, adjacent to the ceramic walls further reduce the space available for locating a gas nozzle through the wall. Thus there is a need for a gas distributor that provides a uniform distribution of process gas in a process chamber having ceramic walls or ceilings without requiring a hole or other feed-through to be drilled through the ceramic component.

Yet another problem with current process chambers is that a relatively large amount of process gas is required to provide uniform processing rates across the substrate as compared to the amount of process gas actually consumed during processing of the substrate. Conventional process chambers require an abundance of process gas to assure complete processing of the semiconductor substrates. For example, typical CVD processes are 30 to 68% efficient, which leaves 70 to 32% of the unconsumed process gas exhausted in the effluent gas. Typical etch processes are even less efficient and often use as little as 10% of the total volume of process gas. These inefficiencies in process gas utilization increase the processing cost per substrate, particularly when the process gas is expensive. Also, excessive emissions of unconsumed process gases necessitate some form of effluent abatement apparatus to reduce the toxic or environmentally hazardous compounds in the effluent process gas, which is also expensive.

Thus there is a need for a process chamber having a gas distributor that provides a uniform distribution of process gas in the chamber, particularly for large diameter substrates. There is a further need for a gas distributor that increases the efficiency of utilization of process gas in the chamber, and thereby reduces environmentally hazardous emissions. There is also a need for a gas distributor that does not require holes or feed-throughs in ceramic walls in order to provide a uniform distribution of gas in the chamber.

SUMMARY

In one aspect of the invention a substrate processing method comprises supporting a substrate in a process zone; directing a flow of process gas against a surface above the process zone; before or after the previous step, energizing the process gas; and exhausting the process gas from the process zone.

In another aspect of the invention, a substrate processing method comprises supporting a substrate in a process zone; introducing process gas at an inclined angle relative to the substrate to direct a flow of the process gas toward a surface adjacent the process zone; before or after the previous step, energizing the process gas; and exhausting the process gas from the process zone.

In another aspect of the invention, a substrate processing method comprises supporting a substrate in a process zone; introducing process gas though a plurality of outlets at an inclined angle relative to the substrate, the inclined angle being sufficiently large to allow two streams of process gas to impinge against one another; before or after the previous step, energizing the process gas; and exhausting the process gas from the process zone.

In another aspect of the invention, a substrate processing method comprises supporting a substrate in a process zone; introducing process gas through a first outlet at an inclined angle relative to the substrate and through a second outlet angled relative to the first outlet; before or after the previous step, energizing the process gas; and exhausting the process gas from the process zone.

In another aspect of the invention, a substrate processing method comprises supporting a substrate in a process zone; introducing process gas at an inclined angle relative to the substrate from above the substrate; before or after the previous step, energizing the process gas; and exhausting the process gas from the process zone.

In another aspect of the invention, a substrate processing method comprises supporting a substrate in a process zone; introducing process gas alternately through a plurality of outlets; before or after the previous step, energizing the process gas; and exhausting the process gas from the process zone.

Finally, in another aspect of the invention, a substrate processing method comprises supporting a substrate in a process zone; introducing a first burst of process gas into the process zone through a first nozzle and energizing the process gas; and introducing a second burst of process gas into the process zone through a second gas nozzle while continuing to energize the process gas.

DRAWINGS

These and other features, aspects, and advantages of the present invention will become better understood with regard to the following description, appended claims, and accompanying drawings which illustrate examples of preferred embodiments of the invention, where:

FIG. 2b is a schematic sectional top view of the process chamber of FIG. 2a;

FIG. 5b is a three-dimensional graph of the etch rates according to the contour map shown in FIG. 5a;

FIG. 6b is a three-dimensional graph of the etch rates according to the contour map shown in FIG. 6a;

FIG. 7b is a three-dimensional graph of the etch rates according to the contour map shown in FIG. 7a.

DESCRIPTION

Figure 1:
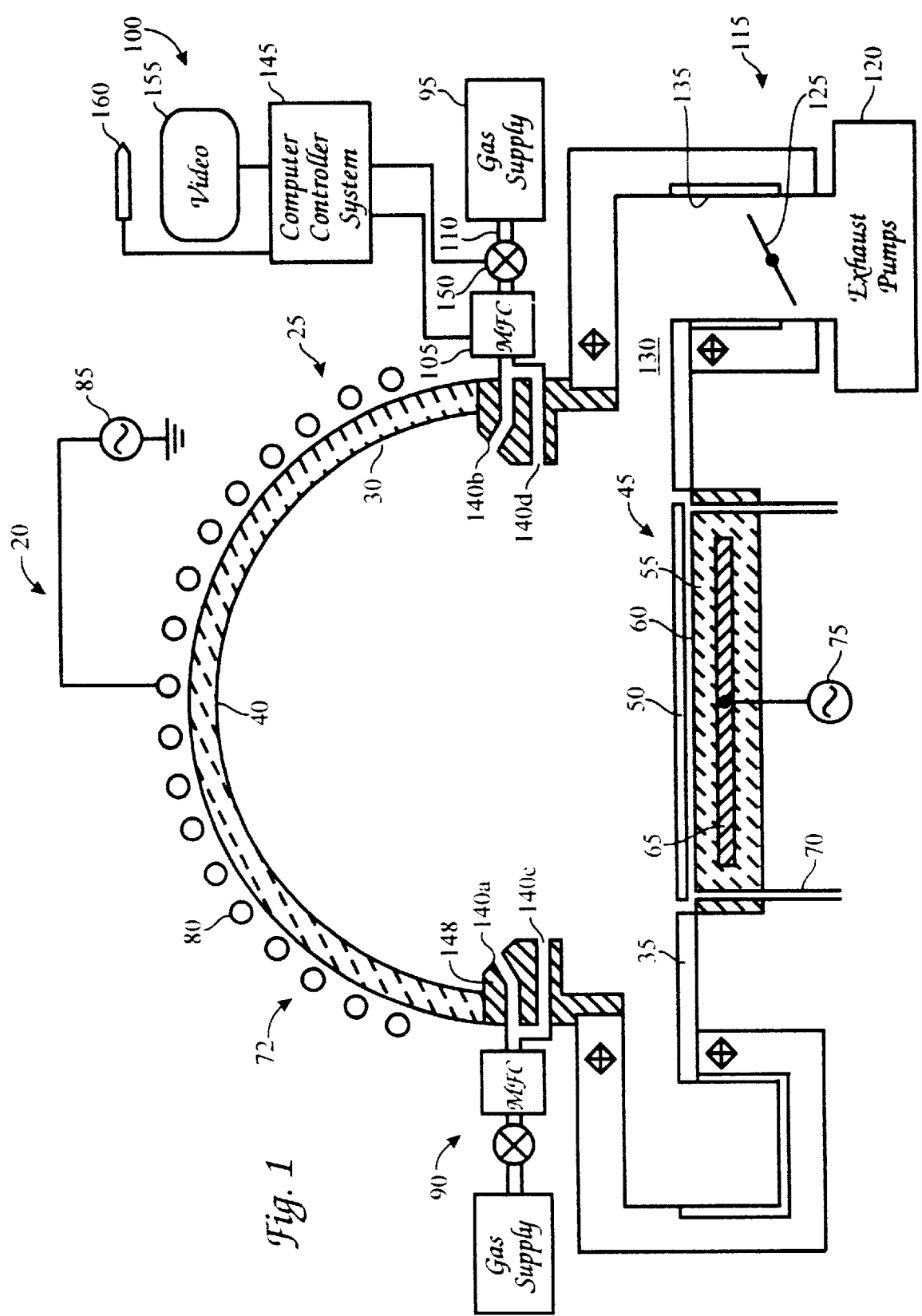
FIG. 1 is a schematic sectional side view of a process chamber and process gas distributor of the present invention.

The process chamber of the present invention processes a semiconductor substrate using a gas distribution system capable of providing a more uniform distribution of process gas in the process chamber. An exemplary apparatus 20 of the present invention is schematically illustrated in FIG. 1, is provided only to illustrate an example of the present invention, and should not be used to limit the scope of the invention. The apparatus 20 generally comprises an enclosed chamber 25 having sidewalls 30, a bottom wall 35, and a ceiling 40. The chamber 25 is fabricated from any one of a variety of materials including metals, ceramics, glasses, polymers, and composite materials. Metals commonly used to fabricate the process chamber 25 include, for example, anodized aluminum, stainless steel, or INCONEL™, of which anodized aluminum is preferred. Ceramic and semiconductor materials that can be used to fabricate the chamber 25 include, for example, silicon, boron carbide, and aluminum oxide.

The process chamber 25 comprises a pedestal or support 45 at the bottom of the chamber 25 for supporting the substrate 50 thereon. Preferably, a dielectric member 55 positioned on the support 45 has a receiving surface 60 for receiving the substrate. The dielectric member 55 comprises a unitary monolithic structure of ceramic or polymer, for example, aluminum oxide or aluminum nitride, with an electrode 65 embedded in the dielectric member 55. Preferably, the electrode 65 is fabricated from a conductive high melting point refractory metal, such as tungsten, tantalum, or molybdenum. As illustrated in FIG. 1, the dielectric member 55 also comprises gas feed-through holes 70 for providing heat transfer gas, such as helium, to the receiving surface 60 below the substrate. Typically, a series of gas feed-through holes 70 are provided around the circumference of the dielectric member 55 to provide a uniform distribution of heat transfer gas in the region below the substrate 50.

The electrode 65 in the dielectric member 55 has dual functions, serving both as a gas energizer 72 or plasma generator for energizing and sustaining a plasma from the process gas in the chamber 25 by capacitively coupling to an electrically biased or grounded surface of the chamber 25, and also as an electrostatic chuck that generates an electrostatic charge for electrostatically holding the substrate 50. An electrode voltage supply 75 maintains an electrical potential between the electrode 65 and a surface of the chamber 25, such as the ceiling 40. Preferably, both a DC chucking voltage and an RF bias voltage are applied to the electrode 65 through an electrical connector. The RF bias voltage comprises one or more frequencies from 13.56 MHZ to 400 KHz at a power level of from about 50 to about 3000 Watts. The DC voltage is typically from about 250 to about 2000 volts, and is applied to the electrode 65 to generate electrostatic charge that holds the substrate 50.

The apparatus 20 comprises a dome-shaped ceiling 40 that serves as a window for coupling an RF induction field transmitted by an inductor antenna 80 adjacent to the ceiling 40 to energize the process gas in the chamber. By dome shaped it is meant a single or multiple radius dome, planar, conical, truncated conical, cylindrical, multi-sided polyhedral shaped ceiling member, or combination of such shapes. Preferably, the inductor antenna 80 comprises multiple coils having a circular symmetry with a central axis coincident with the longitudinal axis of the process chamber 25 and perpendicular to the plane of the substrate 50. The circular symmetry of the multiple coils provides a spatial distribution of inductive electrical field vector components that have a null or minimum along the central axis of symmetry to reduce the number of electrons over the center of the substrate 50, as described in U.S. patent application Ser. No. 08/648,254, which is incorporated herein by reference. Preferably, each coil comprises from about 1 to about 10 turns, and more typically from about 2 to about 6 turns.

In one version, the ceiling 40 is made from dielectric or semiconducting material that has a low impedance to the RF induction field of the inductor antenna 80, and has an electric field susceptibility that is sufficiently low to transmit the RF induction field generated by the inductor antenna 80 through the ceiling 40 with minimum loss of power. For example, the ceiling can be made from aluminum oxide that is transparent to RF induction fields. The ceiling 40 can also be made from metal or semiconductor material, and maintained at an electrical potential or electrical ground. Typically, an RF source power supply 85 powers the inductor antenna 80, and the electrode voltage supply 75 biases the electrode 65 relative to the ceiling 40. Instead of the electrode 65 or the inductor antenna 80, the gas energizer 72 can also comprise a microwave or other source of ionizing radiation capable of energizing the process gas before or after injection into the process chamber.

The process gas and process gas byproducts that are formed during processing of the substrate are exhausted by an exhaust system 115 comprising exhaust pumps 120 (typically including a 1000 liter/sec turbo molecular pump and roughing pump) with a throttle valve 125 in the exhaust line to control the pressure of process gas in the chamber 25. Preferably, an annulus surrounding the lower portion of the chamber 25 forms an asymmetric pumping channel 130 for pumping gas out of the chamber 25 to provide a more uniform distribution of gaseous species around the surface of the substrate. The interior of the asymmetric pumping channel 130 is lined with a replaceable metal liner 135 to facilitate removal and cleaning of residue formed on the annulus.

To process the substrate, process gas is introduced into the chamber 25 through a gas distributor 90 (or gas distribution system) of the present invention that generally includes a process gas supply 95, a gas flow controller 100 that operates mass flow controllers 105 that control the flow of gas through a gas feed conduit 110, and one or more gas injection nozzles 140 that direct the flow of process gas into the chamber 25. The process gas supply 95 comprises a conventional gas supply, such as a tank of compressed process gas. The gas flow controller 100 controls the flow of process gas and typically comprises a computer controller system 145 and computer program that operates the mass flow controllers 105 and/or pneumatic or solenoid valves 150 in each gas feed conduit 110 that extends to a particular gas nozzle 140. Preferably, the gas feed conduit 110 extends through the sidewalls 30 of the chamber 25 so that holes or other feed-throughs do not have to be machined through the ceiling 40.

The gas nozzles or outlet 140 comprise a single gas nozzle or more preferably a plurality of gas nozzles or outlets 140*a,b,c,d*. Preferably, the multiple gas nozzle version comprises pairs of gas nozzles 140*a,b* that face each other across the diameter of the chamber 25. In the paired configuration, a first gas nozzle 140*a* injects a first gas stream at an inclined angle relative to a plane of the substrate 50 into the chamber 25; and a second gas nozzle 140*b* facing the first gas nozzle 140*a*, injects a second gas stream also at an inclined angle relative to the plane of the substrate 50. While a single pair of facing inclined gas nozzles 140*a,b* can be used, it is preferred to have multiple pairs of gas nozzles 140*a,b* and 140*c,d*, as shown in FIG. 1. More preferably, the multiple facing pairs of gas nozzles 140*a,b,c,d* comprises one or more groups of gas nozzles 140 that are spaced apart and positioned around the periphery of the substrate 50 to provide a uniform flux of process gas entering the chamber 25 from around the periphery of the substrate 50. In a preferred embodiment, the gas distributor 90 comprises at least four to eight gas nozzles 140 spaced apart and positioned symmetrically at 90° or 45° intervals around the circumference of the chamber 25 to inject process gas uniformly into the entire process chamber.

Preferably, at least one group of first and second gas nozzles 140*a,b* inject first and second gas streams at an inclined angle relative to the plane of the substrate 50. The angle at which the gas streams are injected is sufficiently large to cause the first and second gas streams to impinge against one another and form a circulating gas flow stream that rises to the ceiling 40 above the center of the substrate 50 and descends along the periphery of the substrate 50, as illustrated by the gas flow path lines of FIGS. 2*a* and 2*b*. Preferably, the gas nozzles 140 are positioned in an inclined surface of an annular collar 148 or in the sidewalls 30 of the chamber 25. Each outlet of the gas nozzles 140 comprises a longitudinal channel having a central axis that forms an inclined upward angle relative to the plane of the substrate 50, to propel the gas stream toward the ceiling 40 of the chamber 25. It has also been discovered that a preferred angle of inclination for the longitudinal channel which determines the angle of inclination of a central axis of the gas streams flowing into the chamber is from about 30 to about 80°, and more preferably from about 40 to about 60°. At these angles, the gas streams from the gas nozzles 140 have been found to provide a circulating gas flow pattern that provides a uniform distribution of process gas across the surface of the substrate 50 and significantly improves substrate yields.

In a preferred embodiment, the gas distributor 90 comprises a first group of facing inclined gas nozzles 140*a,b* that inject gas streams at an inclined angle relative to the plane of the substrate 50, and a second group of facing non-inclined gas nozzles 140*c,d* that injects gas stream in a plane that is substantially parallel to the plane of the substrate 50. In a preferred configuration, the gas nozzles 140 are mounted in the annular collar 148 that extends around the circumference of the chamber 25. The collar 148 has an inclined surface containing the group of inclined gas nozzles 140*a,b* that inject gas at an inclined angle into the chamber 25 and a perpendicular surface containing the group of directly opposing gas nozzles 140*c,d* that inject gas parallel to the plane of the substrate 50. The annular collar 148 provides a smooth and flat surface for containing the gas nozzles 140 from which residue deposits can be easily cleaned, and also serves to contain the process gas about the substrate. The annular collar 148 can be machined from a block or segmented blocks of ceramic material or metal material, that contain the conduits and outlets of the gas nozzles 140.

In operation, the inclined gas nozzles 140*a,b* inject their gas streams at an inclined angle, causing the inclined gas streams to impinge against one another, coalesce, and form a combined gas stream that rises above the center of the substrate 50, strikes the opposing ceiling 40 or other surface of the chamber 25, and descends along the periphery of the substrate 50. The opposing gas nozzles 140*c,d* that inject their gas streams directly against one another cause their gas streams to impinge directly above the center of the substrate 50 so that a portion of the combined gas stream descends on the center of the substrate 50 and another portion of the gas stream rises up above the center of the substrate 50. The combination of gas streams rising upwardly and downwardly across the center and periphery of the substrate provide a gas distribution across the chamber 25 that results in uniform processing rates across the entire surface of the substrate 50. The number and angle of inclination of the inclined gas nozzles 140*a,b* and the number of the opposing gas nozzles 140*c,d* depends on the size of the process chamber and the volumetric flow rate of process gas through the gas nozzles 140. Although described as two groups of gas nozzles, the gas distributor 90 can also comprise a plurality of groups of inclined and non-inclined gas nozzles 140, each group of gas nozzles being inclined at a different angle relative to the plane of the substrate 50 or relative to the shape of the surface of the ceiling 40. Preferably, the groups of gas nozzles 140 are positioned symmetrically to one another in the chamber 25, and are spaced apart at equal intervals along the chamber to alternate position the inclined gas nozzles 140*a,b* and non-inclined gas nozzles 140*c,d*.

The circulating gas flow streams provided by the facing gas nozzles 140 works particularly efficiently in combination with a curved chamber surface, such as the domed shaped ceiling 40 that faces and opposes the processing surface of the substrate 50. In this version, the upwardly moving gas stream above the center of the substrate 50 strikes the chamber ceiling 40 and is redirected in a circular flow path by the curved ceiling 40 toward the periphery of the substrate 50. Preferably, the curved ceiling 40 comprises an average radius of curvature that is sufficiently large to direct the upwardly rising gas stream downward and toward the periphery of the substrate 50. The domed ceiling 40 preferably comprises a multiradius dome having multiple radii of curvature with a mean or average radius of curvature of at least about 150 mm. Other facing curved surfaces having an apex, such as conical or other radially symmetric or concentric shapes, can also be used to redirect the process gas in the chamber 25. The process gas flow path redirected by the curved ceiling 40 provides a more uniform distribution of process gas species across the surface of the substrate 50 and better etching or deposition process uniformity across the substrate surface.

Figure 2A:
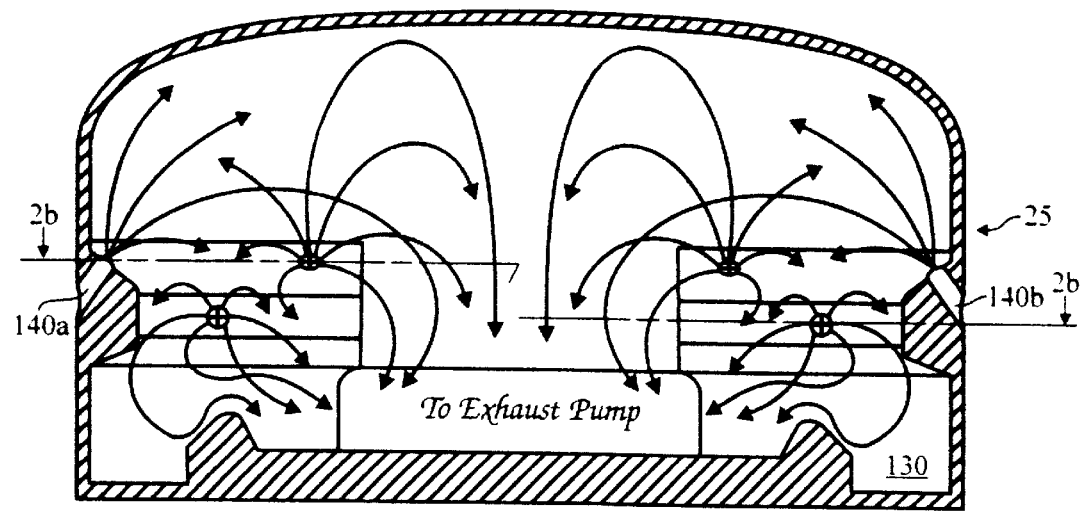
FIG. 2a is a schematic sectional side view of the process chamber and process gas distributor of the present invention showing the gas flow paths.
Figure 2B:
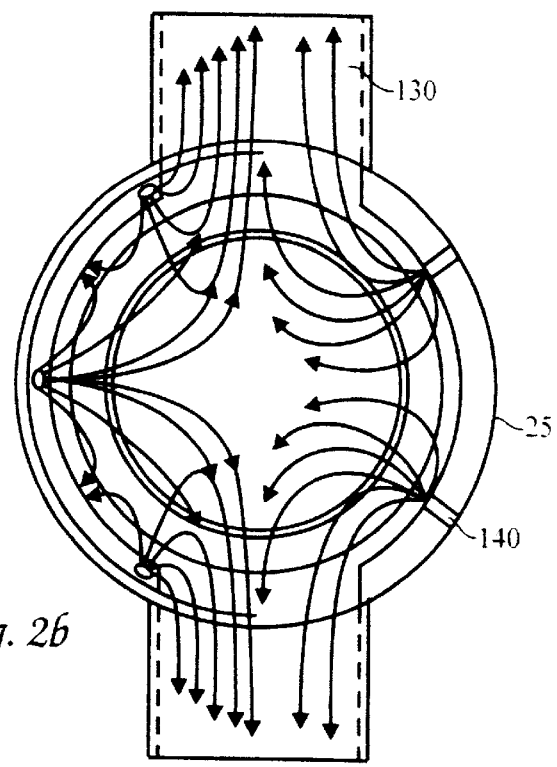

To process a substrate, the process chamber 25 is evacuated and maintained at a predetermined subatmospheric pressure. The substrate 50 is then deposited on the support 45 by a robot arm and lift pin system (not shown). The electrode 65 is electrically biased with respect to the substrate 50 by an electrical voltage. Process gas that is introduced into the process chamber 25 via the gas nozzles 140 is energized to form an energized process gas or plasma by maintaining coupling RF energy into the chamber 25 using coils and/or electrically biased process electrodes. FIGS. 2a and 2b illustrate the gas flow lines in the process chamber 25 showing that the process gas rises up toward the ceiling 40, flows downward along the periphery of the substrate 50, and then flows into the asymmetric channel 130 of the exhaust system 115. Fresh process gas enters the process chamber 25 via the inclined or opposite facing gas nozzles 140 and circulates in a radially symmetrical gas flow path. Even though the gas nozzles 140 are located along the circumference of the sidewalls 30 of the chamber 25, the resultant circular or elliptical gas flow path simulates a gas flow stream that would occur from a gas distributor that extends gas nozzles through the ceiling 40 because at least a portion of the gas stream inside the chamber flows from the top of the chamber down towards the sides of the chamber walls. Also, because the gas flow path is from the top of the chamber 25 and downward toward the substrate, there is less contamination of the substrate 50 by etchant residue and particulates that otherwise flake off from around the substrate or gas nozzles 140. The resultant increased relative pressure of gas immediately above the substrate 50 provides an enhanced uniformity of processing rates across the substrate 50 and uses less process gas to process the substrate 50. As a result, smaller amounts of process gas are released in the gaseous effluent to provide more environmentally safe processing.

The apparatus 20 described herein can be used to deposit material on a substrate 50 such as by chemical vapor deposition, etch material from the substrate, or clean contaminant deposits deposited on walls and components in the chamber 25. Typical chemical vapor deposition processes that can be performed to deposit coatings on a substrate 25 are generally described in Chapter 9, VLSI Technology, 2nd Ed., Ed. by Sze, McGraw-Hill Publishing Co., New York, which is incorporated herein by this reference. For example, $SiO_2$ is deposited by a process gas comprising (i) silicon source gas for example $SiH_4$ or $SiCl_2H_2$, and an oxygen source gas such as $CO_2$ and $H_2O$, or $N_2O$; or (ii) a single gas containing both silicon and oxygen such as $Si(OC_2H_5)_4$. Other conventional CVD process gases include $NH_3$, $N_2$, $AsH_3$, $B_2H_6$, $KCl$, $PH_3$, $WF_6$, and $SiH_4$. The apparatus 20 can also be used for other etching processes as generally described in *VLSI Technology, Second Edition,* Chapter 5, by S. M. Sze, McGraw-Hill Publishing Company (1988), which is incorporated herein by reference. Typical processes or etching metal layers use process gases such as $BCl_3$, $Cl_2$, $SF_6$, $CF_4$, $CFCl_3$, $CF_2Cl_2$, $CF_3Cl$, $CHF_3$ and $C_2ClF_5$. Resist etching processes typically use oxygen gas to etch the polymeric resist on the substrate 50.

In any of the embodiments described herein, the process gas can also comprise a neutral or non-reactive carrier gas that is added to the reactive gases in a volume percent ratio of about 20 to about 80 volume %, and more preferably from 40 to 70 volume %. The carrier gas further reduces the volume of the process gas that is used for processing the substrate 50 and also further reduces emissions of toxic or hazardous gases in the effluent. The carrier gas serves to transport the active gas species past the substrate surface to maximize the amount of carrier gas that reacts with the substrate 50. The carrier gas operates particularly efficiently in conjunction with the gas distributor 90 by efficiently transporting reactive gaseous species throughout the chamber 25 and evenly past the processing surface of substrate 50.

The process chamber 25 of the present invention provides significantly improved processing uniformity. It is believed that these results occur because theoretical diffusive gas flow does not occur in all chambers operated at low chamber pressures, as commonly believed in the art. It has been discovered that in some regions the process gas diffuses through the chamber, and in other regions, steady state flow patterns of process gas occur during processing. The steady state flow patterns affect the distribution of gas species and the processing uniformity of the substrate surface. The gas flow distributor 90 of the present invention provides steady state gas flow streams that result in a more uniform distribution of gaseous species in the chamber 25 and enhanced processing uniformity. The gas flow streams also reduce gas stagnation regions and prevent excessive deposition of process residues on chamber walls and on the substrate 50. The gas flow stream across the surface of the substrate 50 also provides more efficient utilization of the process gas thereby decreasing hazardous or toxic gas in the effluent gas.

In another aspect of the present invention, the flow of process gas into the chamber 25 is regulated to provide pulsed bursts of process gas into the chamber 25. In this aspect, the flow of process gas to a gas nozzle 140 is turned on and thereafter turned off, while processing a substrate 50, to provide short pulsed bursts of gas into the chamber 25. The gas flow controller 100 regulates the flow of process gas through one gas nozzle 140 or groups of gas nozzles 140a,b,c,d for a predefined time period, and thereafter, stops the flow of process gas through the gas nozzle(s). Thereafter, the gas flow controller 100 regulates the flow of process gas through another gas nozzle (or another set of gas nozzles) for another time period, and then stops the flow of process gas through that gas nozzle, and so on. The starting and stopping of gas flow through the gas nozzles 140 is repeated at least once, and more preferably, a multitude of times, during processing of the substrate 50. For example, the gas flow controller 100 activates the gas flow valves 150 on one gas nozzle to flow gas into the chamber 25 for about 1 to about 50 seconds, shuts off the flow valve for 1 to 50 seconds, and then turns back on the gas flow for about 1 to about 50 seconds, and so on. Preferably, the pulsed bursts of process gas into the chamber are provided through an individual or sets of gas nozzles 140 that are positioned around the periphery of the substrate 50, a suitable number of gas nozzles comprising from two to eight gas nozzles, and more preferably, four to six gas nozzles that are uniformly spaced apart in the chamber 25.

By sequentially, or in an overlapping manner, turning on and off the gas flows to various gas nozzles 140 positioned around the circumference of the chamber 25, the distribution and flow pattern of process gas species in the chamber 25 is controlled in a predetermined manner. Further control over the distribution of gas in the chamber is possible by varying the flow rates of the process gas injected through each gas nozzle 140, the time period for which the process gas flows through particular gas nozzles 140, and the timed sequence of process gas flow through a set of gas nozzles 140 in relation to the position of the gas nozzles in the chamber.

Each sequence of process gas flow through a set of gas nozzles 140 forms a process cycle, and the process cycles are repeated multiple times during processing of a single substrate 50. Typically, in each process cycle, process gas is introduced through a gas nozzle for a period of from about 1 to about 10 seconds, and more preferably, a period of from about 1 to about 5 seconds. The number of cycles is based on the total process time desired. For example, if the process gas is introduced into each gas nozzle for 2 seconds only, and the total substrate process time to completion is 40 seconds, a total of about 5 cycles are to be performed, each cycle providing process gas for about 8 seconds into the chamber 25.

Figure 3A:
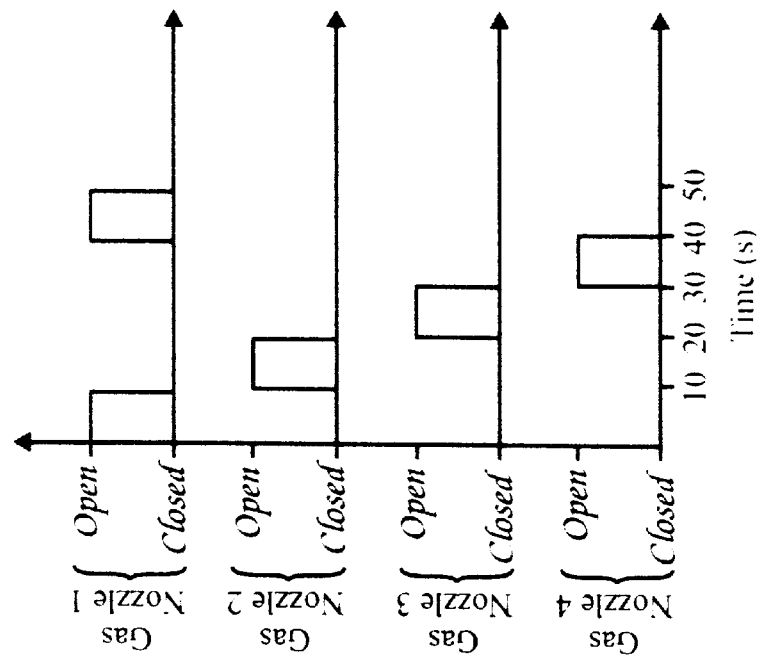
FIGS. 3a to 3c are graphical representations of gas flow timing sequences for actuating flow controllers for supplying process gas to the gas nozzles.
Figure 3B:
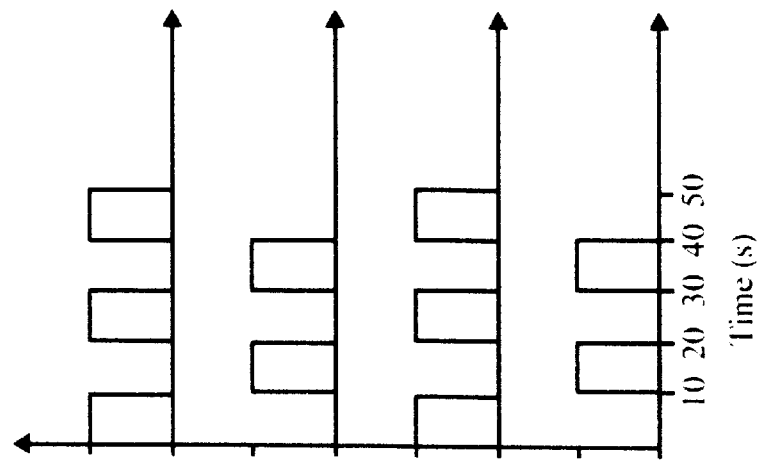
Figure 3C:
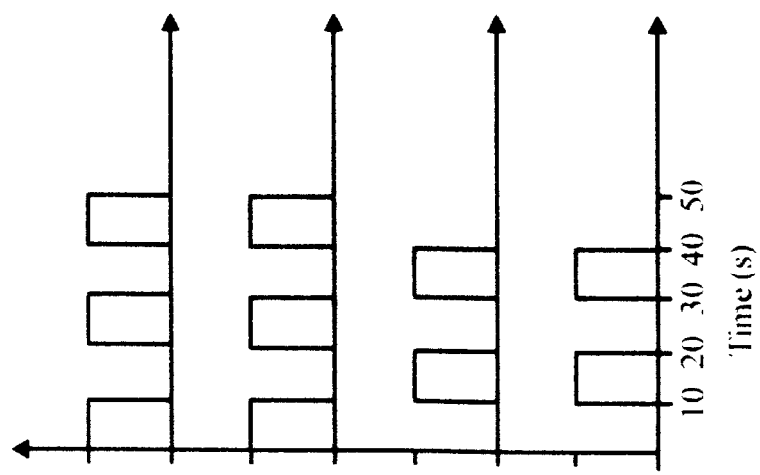

FIGS. 3a to 3c illustrate exemplary different process gas flow timing sequences for actuating sets of gas nozzles 140 in the chamber 25. These figures are graphical representations of the timing sequence, or the period of duration of the opening and closing of each valve 150 that supplies process gas to one of four gas nozzles 140 positioned circumferentially along the sidewalls of the chamber 25. A gas flow valve 150 of a particular gas nozzle 140 is opened for a predefined period of, for example, 10 seconds, to provide a source of process gas into the chamber 25, and thereafter, the gas flow valve is shut off, and another gas flow valve is turned on to provide another source of process gas into the chamber. The gas flow timing cycle of FIG. 3a comprises a first cycle comprising four steps in which process gas is first introduced through a first gas nozzle 140, and then sequentially flowed through each of the second, third, and fourth gas nozzle to complete the cycle. The timed sequence of operation of the gas flow valves 150 is such that the source or ingress of the gas flow into the chamber 25 appears to rotates around a central longitudinal axis of the chamber 25 along the circumference of the process chamber. The adjacent gas nozzles 140 can be turned on and off to provide an apparent rotating gas source that moves in a clockwise or counter-clockwise. Alternatively, the flow of process gas can be pulsed in a different sequence of gas nozzles, or in an overlapping sequence of gas nozzles, from one gas nozzle to another gas nozzle around the circumference of the chamber 25. For example, in a typical overlapping sequence, gas nozzle 1 is opened to flow process gas into the chamber 25, and before gas nozzle 1 is closed, adjacent gas nozzle 2 is opened and only after gas nozzle 2 is open for a predefined overlapping time, is gas nozzle 1 shut off. Thereafter, gas nozzle 3 is opened while gas nozzle 2 is still open, and then gas nozzle 2 is shut off, and so on, to provide a rotating and overlapping timing sequence of pulsed gas sources around the circumference of the chamber 25.

In another preferred embodiment, illustrated in FIG. 3b, the gas flow controller 100 alternates the flow of the first and second process gas streams between a pair of facing gas nozzles 140 that face one other at one location in the process chamber 25 to another pair of facing gas nozzles 140 that face each other at another location in the process chamber 25. In this version, the gas flow is initially provided through a leading pair of first and second gas nozzles 140a,b that face one another. Before or after turning off the flow of gas through the leading pair of gas nozzles 140a,b, the gas flow through a secondary pair of gas nozzles 140c,d is turned on, allowing process gas to flow into the chamber 25 from another pair of gas injections nozzles 140c,d at a different location in the chamber 25. Preferably, the gas distributor 90 comprises at least two pairs of nozzles that are located 90° apart along a perimeter of the chamber 25, each pair of nozzles opposing and facing each other. Each gas nozzle 140a,b of a facing pair of nozzles is turned on simultaneously to provide first and second gas flow streams injected through a facing pair of gas nozzles 140a,b and then turned off. Thereafter, each gas nozzle 140c,d of a second pair of facing gas nozzles is turned on, and thereafter turned off. Thus the two pairs of gas nozzles 140a,b and 140c,d are sequentially actuated to provide pulsed bursts of process gas from process gas sources that are located on two lines cutting across the chamber 25 at right angles to one another. For example, as shown in FIG. 3b, the gas nozzles 1 and 3 are opened simultaneously for a first time period T of about 0<T<10 seconds, and gas nozzles 2 and 4 are opened simultaneously for a second time period T of about 10<T<20 seconds. Alternatively, as shown in FIG. 3c, two adjacent gas nozzles 140 which are 90° apart can also be simultaneously opened to supply process gas through adjacent pairs of gas nozzles, instead of through pairs of facing gas nozzles. Any other operative combination of facing or adjacent gas nozzles is also within the scope of the present invention, as would be apparent to one of ordinary skill.

The timing sequence of flowing process gas through various gas nozzles 140 can also be regulated to control the gas flow path or flow pattern in the chamber 25. Turning on and off a series of gas nozzles 140 positioned around the chamber 25, effectively changes the location of ingress of the gas into the chamber 25 to different positions along the circumference of the chamber 25. For example, gas streams can be injected through one or more nozzles 140 located at one position in the chamber 25, and thereafter, gas streams can be injected through other gas nozzles 140 located at a different position in the chamber 25. Gas flow streams injected through pairs of facing gas nozzles 140a,b strike one another and coalesce to form an upwardly directed stream of gas, that upon impinging on the dome shaped ceiling 40 is redirected toward the periphery of the substrate 50. The resultant flow of gas that moves vertically up along the center of the chamber 25 and along sidewalls 30 of the process chamber 25 has been found to significantly improve the process etching uniformity, especially when the gas stream rotates around different positions along the circumference of the chamber 25.

The pulsed flow of gas is particularly suitable for introducing etching gas into etching chambers 25 for etching the substrate 50 because it provides more uniform etching rates across the surface of the substrate 50. In particular, the rotating gas inlet source has been found to significantly improve the process etching uniformity. For example, a preferred sequence of gas flow pulses for an etching process conducted with four gas nozzles 140 around the substrate 50 comprises the following steps: (i) gas nozzle 1 turned on for 2 seconds and stopped, (ii) gas nozzle 2 turned on for 2 seconds and stopped, (iii) gas nozzle 3 turned on for 2 seconds and stopped, (iv) gas nozzle 4 turned on for 2 seconds and stopped, and (v) optional repetition of these steps for one or more cycles until the substrate is processed. Other gas flow sequences can also use pulsed gas bursts of from 0.1 to 2.5 seconds depending on the processing type and the number of gas nozzles.

In the embodiments described above, a computer controller system 145 preferably operates the process chamber 25 and gas nozzles 140. The computer controller system comprises a computer program code product that controls a computer comprising one or more central processor units (CPUs) interconnected to a memory system with peripheral control components, such as for example, a PENTIUM microprocessor, commercially available from Intel Corporation, Santa Clara, Calif. The CPUs of the computer controller system 145 can also comprise ASIC (application specific integrated circuits) that operate a particular component of the chamber 25, such as the gas nozzles 140. The interface between an operator and the computer system 145 is typically a video monitor 155 and a light pen 160. To select a particular screen or function, the operator touches a designated area of a screen displayed on the CRT monitor 155 with the light pen 160 and pushes the button on the pen. The area touched changes its color, or a new menu or screen is displayed, confirming the communication between the light pen 160 and the CRT monitor 155. Other devices, such as a keyboard, mouse, or pointing communication device can also be used to allow the user to communicate with the computer controller system 145.

The computer program code for operating the CPU(s) and other devices of the computer controller system can be written in any conventional computer readable programming language, such as for example, assembly language, C, $C^{++}$, or Pascal. Suitable program code is entered into a single file, or multiple files, using a conventional text editor and stored or embodied in a computer-usable medium, such as a memory system of the computer controller system 145. If the entered code text is in a high level language, the code is compiled to a compiler code which is linked with an object code of precompiled windows library routines. To execute the linked and compiled object code, the system user invokes the object code, causing the computer to load the code in memory system to perform the tasks identified in the computer program code.

The computer program code comprises one or more sets of computer instructions that operate the timing, process gas composition, chamber pressure, substrate temperature, RF power levels, and other parameters of the process recipe being performed in the process chamber 25. The computer program code also comprises computer instructions code for operating the gas flow distributor system 90, including the operations of turning on/off the gas nozzles, controlling the timing sequence of the gas nozzles, and controlling operation of a gas flow controller 100 to control the flow rates of the process gas through the gas nozzles 140.

Figure 4:
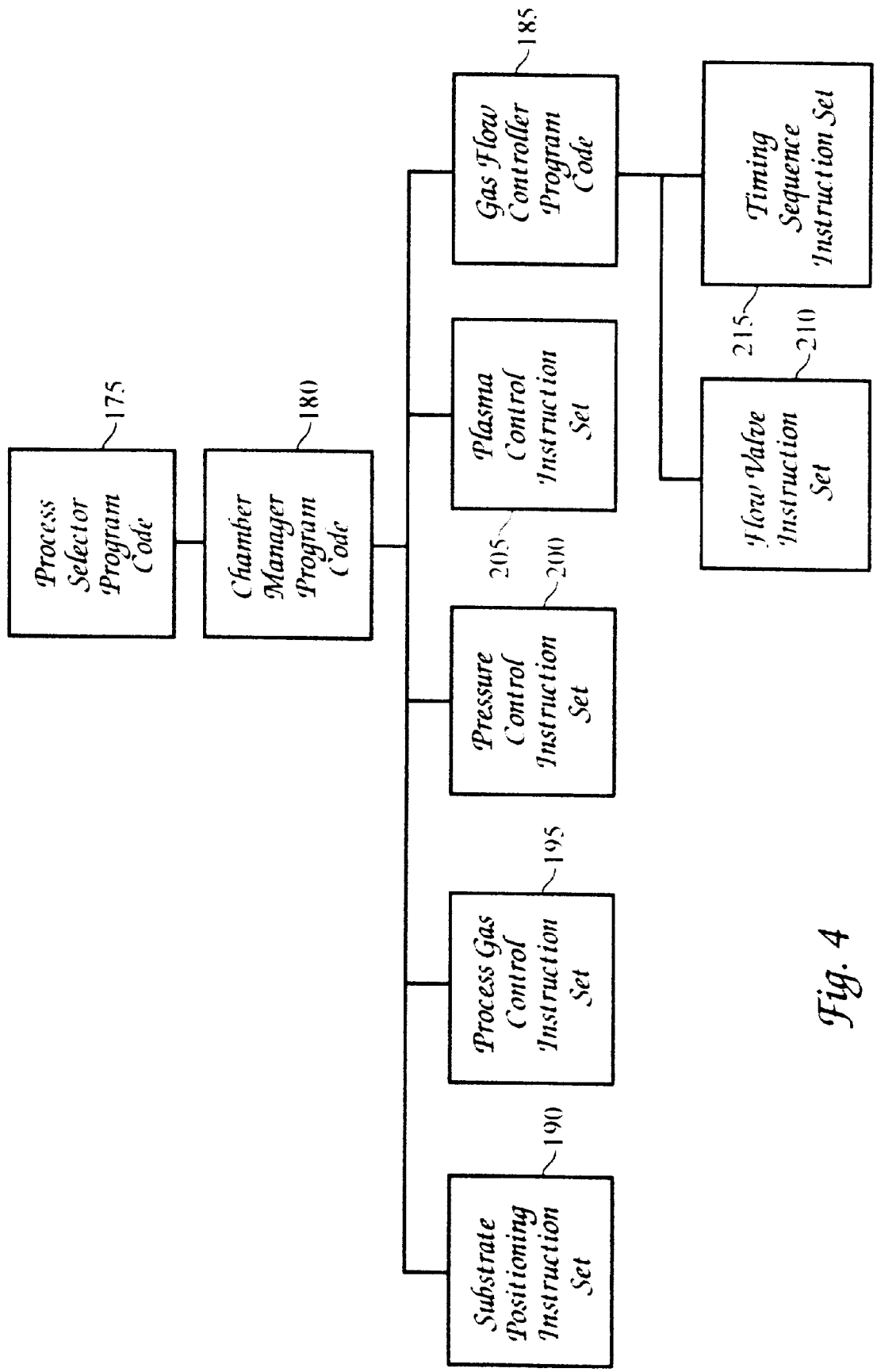
FIG. 4 is an illustrative block diagram of computer program product according to the present invention.

A preferred version of the computer program code, as illustrated in FIG. 4, comprises multiple sets of program code, such as program code 175 that allows an operator to enter or select a process recipe, and that executes operation of the process recipe in a selected process chamber 25, chamber manager program code 180 for operating and managing priorities of the chamber components in the process chamber 25, and gas flow controller program code 185 for operating the gas nozzles 140. While illustrated as separate program codes that perform a set of tasks, it should be understood that these program codes can be integrated, or the tasks of one program code integrated with the tasks of another program code to provide a desired set of tasks. Thus the computer controller system 145 and computer program code described herein should not be limited to the specific embodiment of the program codes described herein, and other sets of program code or computer instructions that perform equivalent functions are within the scope of the present invention.

In operation, a user enters a process set and process chamber number into the process selector program code 175 via the light pen 160 and CRT monitor 155. The process sets are composed of process parameters needed to carry out a specific process recipe in the chamber 25 and the process sets are identified by predefined set numbers. The process selector program code 175 identifies a desired process chamber 25 and set of process parameters to operate the process chamber for performing a particular process. The process parameters include process conditions, such as for example, chamber temperature and pressure, gas energizer parameters such as microwave or RF bias power levels and magnetic field power levels, cooling gas pressure, and chamber wall temperature. The process conditions also include gas composition, flow rates, and gas valve timing sequence that sets the timing of the flow valves 150 of the gas nozzles 140. The timing sequence is stored in a table of timing instructions that lists the timing intervals inputted by the operator, or contains an algorithm for timing the actuation (turn on) or de-actuation (turn off) sequence of the flow valves 150 in the predetermined sequential order of operation.

The process selector program code 175 executes the process set by passing the particular process set parameters to the chamber manager program code 180 which control multiple processing tasks in different process chambers according to the process set determined by the process selector program code 175. For example, the chamber manager program code 180 comprises program code for etching a substrate or depositing material on a substrate in the chamber 25. The chamber manager program code 180 controls execution of various chamber components through code instruction sets which control operation of the chamber components.

Examples of chamber component code instruction sets include a substrate positioning instruction set 190 that controls robot components that load and remove the substrate onto the support 45, process gas control instruction set 195 that controls the composition and flow rates of process gas supplied into the chamber 25, a pressure control instruction set 200 that controls the size of the opening of the throttle valve 125, a gas energizer control instruction set 205 that controls the power level of the gas energizer 72. In addition, a gas flow controller program code 185 operates the gas distributor 90 to control the flow of process gas into the process chamber. In operation, the chamber manager program code 180 selectively calls the chamber component instruction sets in accordance with the particular process set being executed, schedules the chamber component instruction sets, monitors operation of the various chamber components, determines which component needs to be operated based on the process parameters for the process set to be executed, and causes execution of a chamber component instruction set responsive to the monitoring and determining steps.

The gas flow controller program code 185 comprises a flow valve instruction set 210 for controlling each flow valve 150 in the gas conduit to a gas nozzle 140, and a sequence timing instruction set 215 for timing the sequence of opening and closing of the flow valves 150. While described as separate instruction sets for performing a set of tasks, it should be understood that each of these instruction sets can be integrated with one another, or the tasks of one set of program code integrated with the tasks of another to perform the desired set of tasks. Thus, the computer system 145 and the computer program code described herein should not be limited to the specific embodiment of the functional routines described herein; and any other set of routines or merged program code that perform equivalent sets of functions are also in the scope of the present invention.

The flow valve instruction set 210 actuates (turns on) the gas flow valve 150 of a single gas nozzle 140 to flow gas therethrough, or more preferably, simultaneously actuates a pair of gas nozzles 140a,b that face one another to flow gas simultaneously through both the facing gas nozzles. Preferably, the flow valve instruction set 210 actuates a gas flow valve 150 of a particular gas nozzle 140 for a short time period that is less than the time period required to process a particular substrate 50 in the chamber 25, to flow a pulsed burst of process gas into the chamber 25. More preferably, the flow valve instruction set 210 simultaneously actuates flow valves of a pair of facing gas nozzles 140*a,b* for a short time period to flow a first burst of gas through a pair of facing gas nozzles located at one position in the chamber 25, and thereafter, flows a second burst of gas through another pair of gas nozzles 140*c,d* located at a different position in the chamber, as described above.

The sequence timing instruction set 215 sets the timing of the flow valves 150 from a table of sequenced timing instructions and timing intervals entered by the operator into the process selector program code, or an algorithm for timing the actuation (turn on) and de-actuation (turn off) sequence of the flow valves 150 in the desired predetermined sequential order of operation of each valve. Each gas flow valve 150 feeding a particular gas nozzle 140 is identifiable by a particular number for the operator to program a predetermined timing sequence. The sequence timing instruction set 215 comprises code adapted for (i) flowing process gas through a first pair of gas nozzles 140*a,b* for a predetermined time period and thereafter stopping the flow of process gas through the first pair of gas nozzles, and (ii) flowing gas through the second pair of gas nozzles 140*c,d* for another predetermined time period and thereafter stopping the flow of process gas through the second pair of gas nozzles. The sequence timing instruction set 215 repeats steps (i) and (ii) at least once to time the operation of the gas flow valves 150 in the desired predetermined sequence.

EXAMPLES

The following examples, illustrated in FIGS. 5*a* through 7*b,* demonstrate that the process chamber 25 and gas flow distributor 90 of the present invention is capable of providing a uniform distribution of gaseous species and gas flow pattern across the surface of the substrate. In these examples, the chamber 25 comprising four gas nozzles 140 positioned along the sidewalls 30 of the chamber 25, and equally spaced apart at 90° from each other. In these tests, a blanket layer of aluminum deposited to a thickness of about 10,000 Å on the substrate was etched. FIGS. 5*a* through 7*b* illustrate the results of three separate tests in which the angle of the gas nozzles 140 relative to the surface of the substrate 50 was held at 45°, 60°, and 75°, respectively. The etching gas comprised $Cl_2$, $BCl_3$, and $N_2$; the pressure in the chamber 25 was ~10 mTorr; and the temperature of the chamber 25 was maintained at 80° C. The etching gas was pulsed through the gas nozzles 140 in the following sequence (i) facing gas nozzles 1 and 3 turned on for 2 sec and then turned off, (ii) facing gas nozzles 2 and 4 turned on for 2 sec and then turned off. Thereafter, steps (i) and (ii) were repeated a total of 20 process cycles to provide a cumulative processing time of about 40 seconds.

Figure 5A:
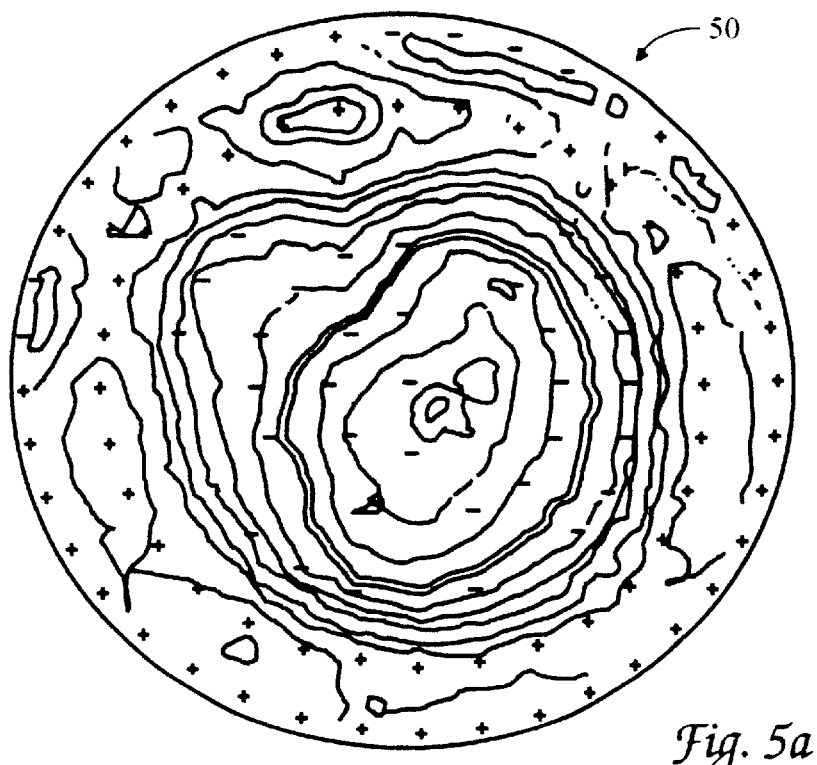
FIG. 5a is a contour map of etch rates of a blanket layer of aluminum on a substrate that is etched in a chamber having gas nozzles inclined at an angle of 45°.
Figure 5B:
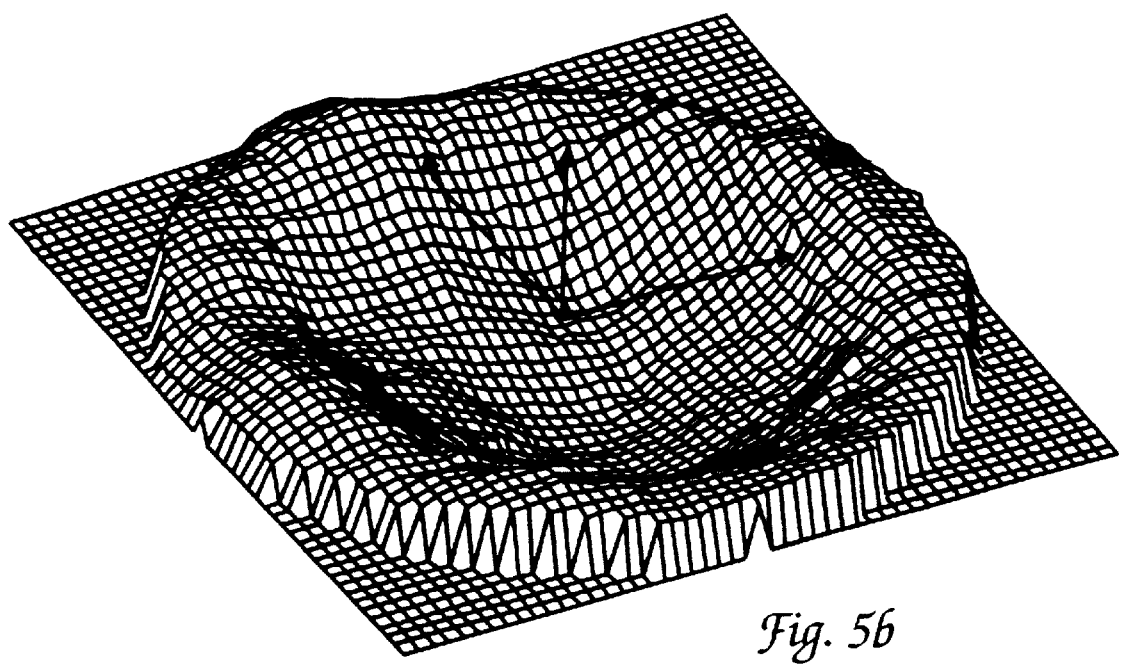

FIG. 5*a* is a contour map of a substrate surface showing contour lines of the amount of etching (representative of the etching gradient) of the surface of the blanket layer of aluminum processed in a process chamber 25 having gas nozzles 140 that injected gas into the chamber at an inclination angle of 45°. Each contour line represents a particular thickness of residual aluminum remaining after etching, that ranged from 2823 Å to 3276 Å. The average thickness of the aluminum etched was about 3093 Å. For a chamber having gas nozzles 140 inclined at an angle of 45°, an etch rate variation of 10.8% with a standard deviation of 1σ across the substrate 50 represents significantly improved uniformity in etching rates across the substrate, as compared to the prior art. FIG. 5*b* is a three-dimensional profile of the contour map of FIG. 5*a,* with the Z-axis representing the etching rates across the surface of the substrate 50, showing slightly higher etch rates along a periphery of the substrate.

Figure 6A:
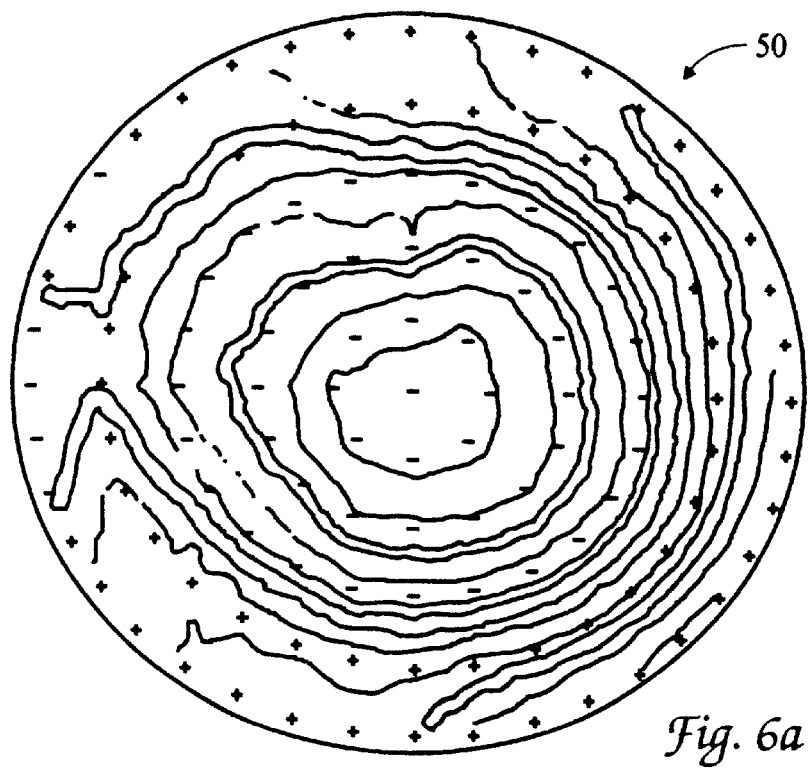
FIG. 6a is a contour map of the etch rates of a blanket layer of aluminum on a substrate that is etched in a chamber having gas nozzles inclined at an angle of 60°.
Figure 6B:
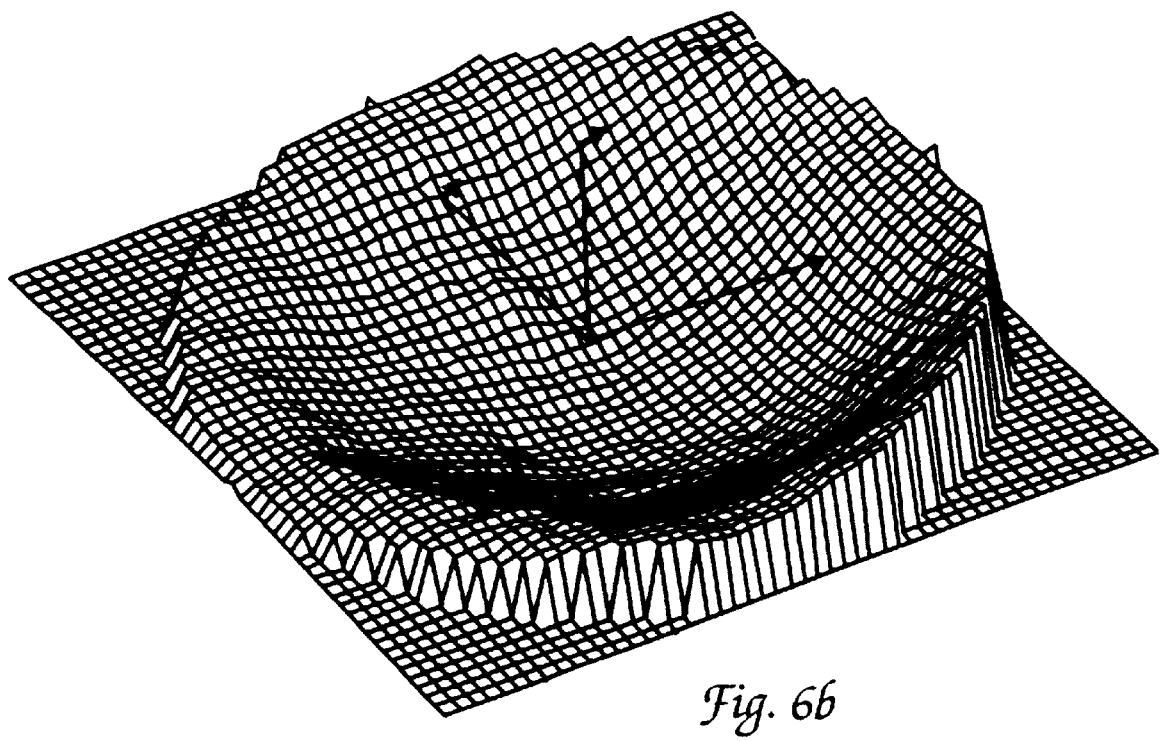

The contour map of FIG. 6*a* shows even greater improvement in etching uniformity in a chamber 25 in which the gas nozzles 140 direct process gas streams toward the curved ceiling 40 at an angle of inclination of 60° relative to the plane of the substrate 50. The thickness of the residual aluminum remaining after etching ranged from 3243 Å to 3899 Å with an average thickness of about 3590 Å. The etching rate varied across the substrate 50 by a 1σ deviation, and the percent change in etching rates was about 4.831%, as compared to a 1σ etching uniformity of 20% for traditional chamber designs having gas nozzles that flow gas in a horizontal or vertical flow path. FIG. 6*b* shows a three-dimensional view of FIG. 6*a,* with the Z-axis representing the etching rate across the substrate 50. From the depression in the middle of FIG. 6*b,* it is seen that slightly higher etch rates were obtained at the periphery of the substrate 50.

Figure 7A:
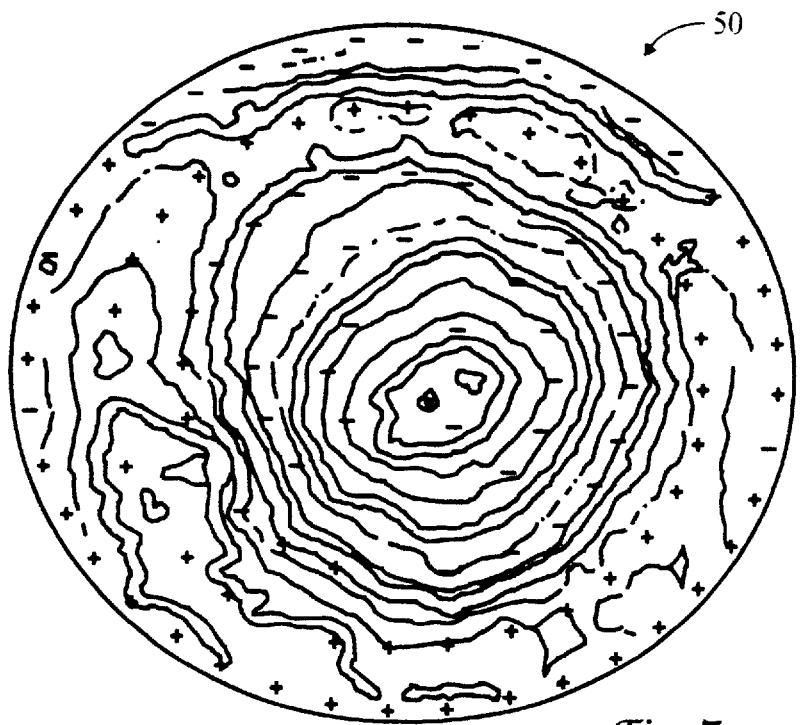
FIG. 7a is a contour map of the etch rates of a blanket layer of aluminum on a substrate that is etched in a chamber having gas nozzles inclined at an angle of 75°.
Figure 7B:
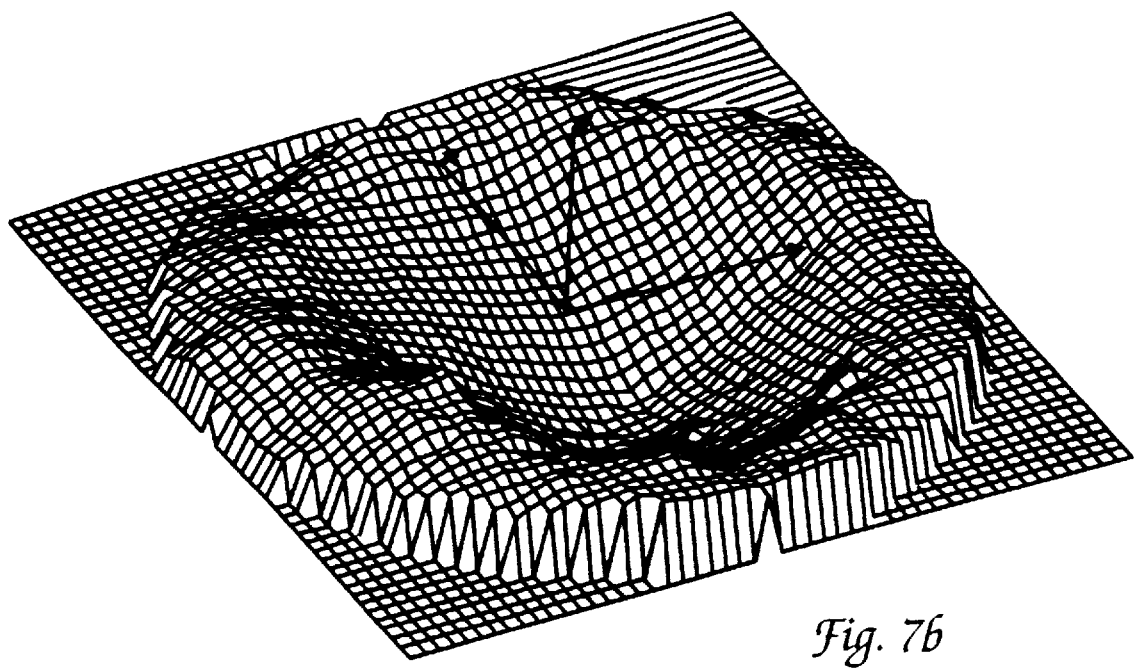

The contour map of FIG. 7*a* represents etch gradient lines of the etched topography surface of the blanket layer of aluminum layer in the chamber 25 in which the gas nozzles 140 were inclined at an angle of 75°. The thickness of the residual aluminum layer remaining after etching ranged from 3051 Å to 3699 Å with an average thickness of about 3386 Å. It is seen that 1σ etching uniformity of 3.578% was obtained. FIG. 7*b* shows a three-dimensional view of FIG. 7*b,* with the Z-axis representing the etching rate across the substrate 50, showing superior uniformity and etching rates.

The gas distributor 90 and chamber of the present invention provide significantly improved processing, as illustrated for processes for etching aluminum layers on substrates 50. The novel gas flow distributors provide directional gas streams that result in a more uniform distribution of gaseous species in the chamber 25, thereby significantly enhancing processing uniformity. Furthermore, the flow of process gas across the substrate 50 and chamber walls reduces gas stagnation regions, gas phase nucleation of undesirable species, and deposition of excessive etchant residues on the sidewalls 30 and components of the chamber 25. The gas flow stream in the chamber has also been found to more efficiently utilize the process gas in the chamber 25, thereby reducing the volume of gas that is used to process a substrate 50, and decreasing concentration of undesirable gaseous hazardous and toxic gaseous species in the effluent.

Although the present invention has been described in considerable detail with regard to the preferred versions thereof, other versions are possible. For example, the location of the gas nozzles 140 be varied as apparent to one of ordinary skill. For example, the gas nozzles 140 can extend through the ceiling 40 or from the bottom wall around the periphery of the substrate. Also, the number and position of the gas nozzles 140 can be arranged to provide the desired gas flow pattern in the chamber 25, depending on the relative size of the substrate 50 and chamber 25. Furthermore, upper, lower, center, ceiling 40, base, floor, and other such terms of spatial orientation or structures can be changed to equivalent or opposite orientations without affecting the scope of the present invention. Therefore, the appended claims should not be limited to the description of the preferred versions contained herein.

What is claimed is:

1. A substrate processing method comprising:
    (a) supporting a substrate in a process zone of a chamber having a surface above the process zone;

(b) directing a flow of process gas against the surface above the process zone;

(c) energizing the process gas; and (d) exhausting the process gas from the process zone.

2. A method according to claim 1 wherein the surface above the process zone is dome shaped.

3. A substrate processing method comprising:

(a) supporting a substrate in a process zone of a chamber having a surface adjacent the process zone;

(b) introducing process gas at an inclined angle relative to the substrate to direct a flow of the process gas toward the surface adjacent the process zone;

(c) energizing the process gas; and (d) exhausting the process gas from the process zone.

4. A method according to claim 3 comprising introducing the process gas at an inclined angle of from about 30 to about 80 degrees relative to the substrate.

5. A method according to claim 3 wherein (a) comprises supporting the substrate in a chamber having a surface above the process zone.

6. A method according to claim 3 wherein (a) comprises supporting the substrate in a chamber having a dome shaped surface adjacent the process zone.

7. A method according to claim 3 wherein introducing the process gas comprises introducing the process gas through a plurality of outlets.

8. A method according to claim 7 wherein introducing the process gas comprises introducing the process gas at an angle sufficiently large to cause two streams of process gas to impinge against one another.

9. A substrate processing method comprising:

(a) supporting a substrate in a process zone;

(b) introducing process gas through a plurality of outlets at an upwardly inclined angle relative to the substrate, the inclined angle being sufficiently large to allow two streams of process gas to impinge against one another;

(c) energizing the process gas; and (d) exhausting the process gas from the process zone.

10. A method according to claim 9 wherein (a) comprises supporting the substrate in a chamber having a surface adjacent to the process zone, and wherein (b) comprises directing the process gas against the surface adjacent to the process zone.

11. A method according to claim 10 wherein the step of directing the process gas against the surface adjacent the process zone comprises directing the process gas against a dome shaped surface adjacent the process zone.

12. A method according to claim 9 comprising introducing the process gas at an inclined angle of from about 30 to about 80 degrees relative to the substrate.

13. A method according to claim 9 comprising alternating the flow of gas between different outlets of the plurality of outlets.

14. A method according to claim 9 wherein (b) comprises introducing the process gas through a plurality of outlets that are above the substrate.

15. A substrate processing method comprising:

(a) supporting a substrate in a process zone;

(b) introducing process gas through a first outlet at an upwardly inclined angle relative to the substrate and through a second outlet angled relative to the first outlet;

(c) energizing the process gas; and (d) exhausting the process gas from the process zone.

16. A method according to claim 15 wherein (b) comprises introducing the process gas substantially parallel to the substrate through the second outlet.

17. A method according to claim 15 comprising introducing the process gas through the first outlet at an inclined angle of from about 30 to about 80 degrees relative to the substrate.

18. A method according to claim 15 wherein (b) comprises introducing the process gas through a plurality of first and second outlets.

19. A method according to claim 18 wherein (b) comprises introducing the process gas through the first outlets at an angle sufficiently large to cause two streams of process gas to impinge against one another.

20. A substrate processing method comprising:

(a) supporting a substrate in a process zone;

(b) introducing process gas at an upwardly inclined angle relative to the substrate from above the substrate;

(c) energizing the process gas; and (d) exhausting the process gas from the process zone.

21. A method according to claim 20 comprising introducing the process gas at an inclined angle of from about 30 to about 80 degrees relative to the substrate.

22. A method according to claim 20 wherein (a) comprises supporting the substrate in a process zone of a chamber having a surface adjacent to the process zone, and wherein (b) comprises introducing the process gas to direct a flow of process gas against the surface adjacent to the process zone.

23. A method according to claim 22 wherein (a) comprises supporting the substrate in a process zone of a chamber having a dome shaped surface adjacent to the process zone, and wherein (b) comprises introducing the process gas to direct the flow of the process gas against the dome shaped adjacent surface.

24. A method according to claim 20 wherein (b) comprises introducing the process gas through a plurality of outlets.

25. A method according to claim 24 comprising introducing the process gas at an angle sufficiently large to cause two streams of process gas to impinge against one another.

26. A substrate processing method comprising:

(a) supporting a substrate in a process zone;

(b) introducing process gas by alternating a flow of the process gas through a plurality of outlets;

(c) energizing the process gas; and (d) exhausting the process gas from the process zone.

27. A method according to claim 26 wherein (b) comprises introducing the process gas through a pair of facing outlets.

28. A method according to claim 26 comprising introducing the process gas at an inclined angle relative to the substrate.

29. A method according to claim 26 wherein (a) comprises supporting the substrate in a process zone of a chamber having a surface adjacent the process zone, and wherein (b) comprises introducing the process gas at an inclined angle relative to the substrate to direct a flow of process gas against the surface adjacent the process zone.

30. A method according to claim 29 wherein (a) comprises supporting the substrate in a chamber having the surface above the process zone.

31. A method according to claim 30 comprising introducing the process gas at an inclined angle relative to the substrate to direct the flow of the process gas against a surface adjacent the process zone that is dome shaped.

32. A method according to claim 26 comprising introducing the process gas so that two streams of process gas impinge against one another.

33. A method according to claim 32 comprising introducing the process gas at an inclined angle relative to the substrate.

34. A substrate processing method comprising:
(a) supporting a substrate in a process zone;
(b) introducing a first burst of process gas into the process zone through a first nozzle and energizing the process gas; and
(c) introducing a second burst of process gas into the process zone through a second gas nozzle while continuing to energize the process gas.

35. A method according to claim 34 further comprising repeating steps (b) and (c) at least once.

36. A method according to claim 34 wherein introducing the first and second bursts of process gas comprises introducing the first and second bursts of process gas at an inclined angle of from about 30 to about 80° relative to the substrate.

37. A method according to claim 34 comprising supporting the substrate in a process zone of a chamber having a curved surface adjacent to the process zone, and further comprising introducing the first and second burst of process gas by directing the process gas against the curved surface.

* * * * *